(12) United States Patent
Remy De Graffenried et al.

(10) Patent No.: US 6,554,244 B1
(45) Date of Patent: Apr. 29, 2003

(54) DEVICE FOR THERMALLY, STABLY SUPPORTING A MINIATURIZED COMPONENT

(75) Inventors: Christian Remy De Graffenried, La Tour-de-Peilz (CH); Marco Antonio Scussat, Milan (IT)

(73) Assignees: Leica Geosystems AG (CH); MTA Automation AG (CH)

( * ) Notice: Subject to any disclaimer, the term of this patent is extended or adjusted under 35 U.S.C. 154(b) by 0 days.

(21) Appl. No.: 09/830,827

(22) PCT Filed: Oct. 29, 1999

(86) PCT No.: PCT/EP99/08207

§ 371 (c)(1),
(2), (4) Date: Oct. 9, 2001

(87) PCT Pub. No.: WO00/28367

PCT Pub. Date: May 18, 2000

(30) Foreign Application Priority Data

Nov. 5, 1998 (DE) .......................... 198 50 888

(51) Int. Cl.[7] .............................................. F16M 11/00
(52) U.S. Cl. ...................... 248/694; 248/901; 359/871; 359/223; 359/819
(58) Field of Search .............................. 248/694, 901; 359/819, 871, 223

(56) References Cited

U.S. PATENT DOCUMENTS

| 4,116,537 A | | 9/1978 | Dilworth | |
|---|---|---|---|---|
| 4,268,123 A | | 5/1981 | Mesco | |
| 5,396,487 A | * | 3/1995 | Abe et al. | 359/819 |
| 5,493,452 A | * | 2/1996 | Hoshino et al. | 359/819 |
| 5,781,355 A | | 7/1998 | Meier | |

FOREIGN PATENT DOCUMENTS

| DE | 36 34 196 A1 | 4/1988 |
|---|---|---|
| DE | 195 33 426 A1 | 5/1996 |
| EP | 0 298 058 A1 | 1/1989 |
| EP | 0 620 464 a2 | 10/1994 |
| FR | 2 534 663 A1 | 4/1984 |
| JP | 56-113109 | 9/1981 |

OTHER PUBLICATIONS

Kryszczynski et al., Material problem in athermalization of optical systems, Opt. Eng., Jun. 1997, pp. 1596–1601, 36(6), Society of Photo–Optical Instrumentation Engineers.

* cited by examiner

*Primary Examiner*—Kimberly Wood
(74) *Attorney, Agent, or Firm*—Rothwell, Figg, Ernst & Manbeck

(57) ABSTRACT

The invention related to a device for supporting a miniaturized, especially electronic or optical component, including a first and a second part, the second part is affixed to the first part on one side at a fixing point, in a cantilevered manner, and supports the component. The projection of the support area of the component onto the first part lies between the fixing point and a predetermined point of reference on the first part. The position of the support area of the component on the second part is chosen in relation to the fixing point between the first and second part and the respective material for the first and second parts is chosen with a specific temperature-dependent expansion coefficient $\alpha_1$ and $\alpha_2$, in such a way that the influence of the temperature-dependent expansion of the first and second part on the position of the support area of the component is at least partially offset in relation to the point of reference.

18 Claims, 1 Drawing Sheet

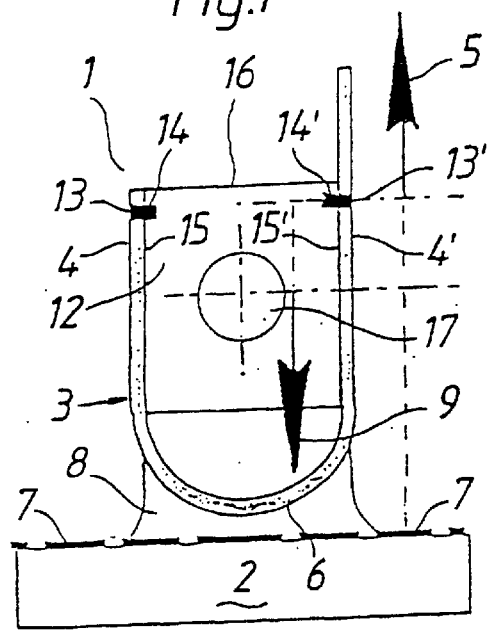
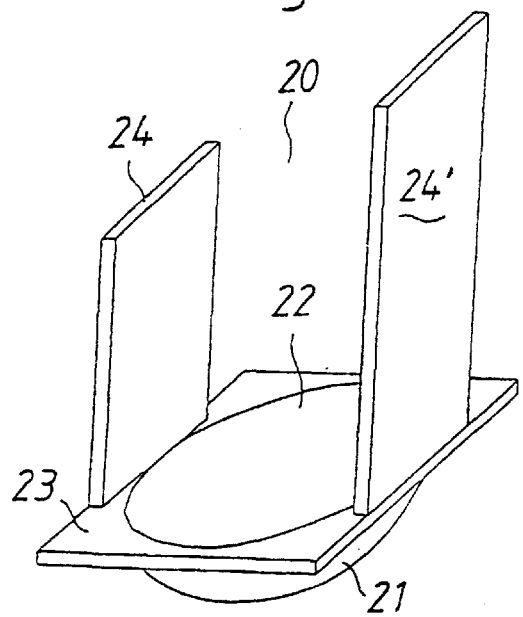
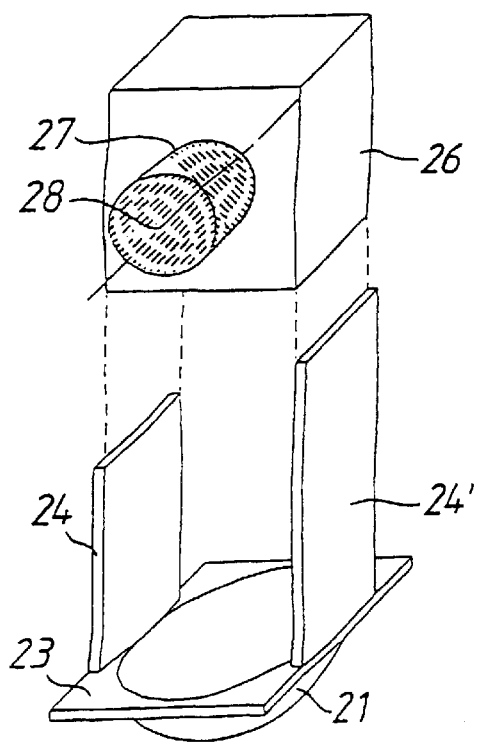
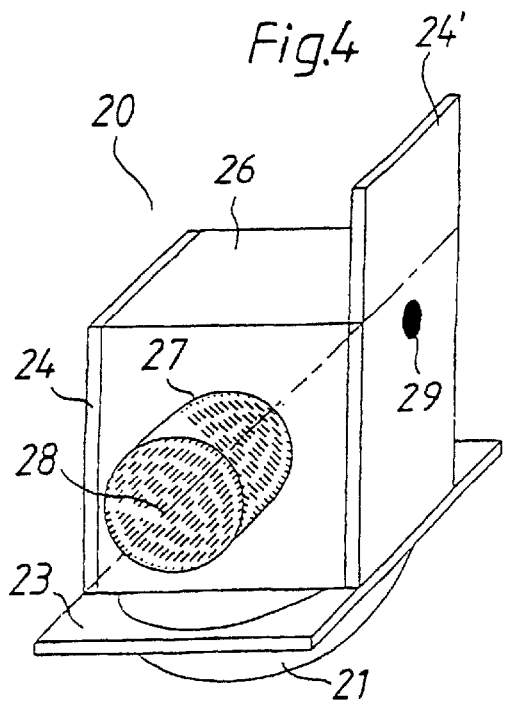

DEVICE FOR THERMALLY, STABLY SUPPORTING A MINIATURIZED COMPONENT

The invention relates to a device for supporting a miniaturized, especially an electronic or optical, component, according to the preamble of claim 1.

DE 195 33 426 A describes a mechanical fastening system for modular, microoptical elements, preferably held in a housing, on a baseplate for the production of an optical or opto-electronic layout. A support is formed with a central platform which carries a single module. At least three legs which are fastened to the baseplate, for example by laser spot welding or soldering, are connected to the platform in an articulated manner, preferably by means of hinges. This known fastening system makes it possible to support optical components in a shock-proof and vibration-proof manner.

It is the object of the invention further to develop a device for supporting a component according to the preamble of claim 1 in such a way that the effect of temperature changes on the position of the component can be compensated as substantially as possible.

This object is achieved, according to the invention, by the features of the characterizing clause of claim 1.

Advantageous further developments of the subject of the invention are described in the subclaims.

Basic concepts of inventive devices and methods are described below.

In a method for surface-mounting three-dimensional, miniaturized, optical devices which are suitable for automated conveyor-belt assembly with six degrees of freedom on a support plate of optical, electronic and miniaturized mechanical components by a flux-free and precise laser soldering method, some modifications have been made to the holding parts for the "TRIMO SMD" technique (three-dimensional miniaturized surface mounted devices) in order to improve the results which can be obtained by this technique.

The support device is now composed of at least two parts which are characterized by low machining precision: a standard holding part, which is produced by die forming, for example of a 0.1 mm thick metal sheet, and the support for the optical element. The shape and the dimensions of the holding parts are customary and in particular have been designed so that they can hold various optical support parts. The standard holding part is formed from a ball socket base, which is covered with a thin tin layer, and from two metal flaps which are arranged perpendicular to the base of the holding part. These flaps are extremely expedient since they permit fixing of the holding part to the optical support part and moreover also enable the holding part to be easily gripped by a robot.

The optical element is usually positioned roughly (±0.2 mm) inside the support part and held by adhesive bonding or mechanical force, which is generally applied by a spring.

Each support part is specially processed in order to hold an optical element, a lens, an optical fiber or a laser diode. The distance between the focal axis and the base of the holding part can be exactly set by moving the position of the optical support part inside the holding part. They can readily be assembled beforehand in various ways, such as by laser spot welding, adhesive bonding or electrical resistance spot welding. As soon as assembly is complete, the holding part can be fixed to a support plate.

Since the two parts which form the support device are completely independent, they can be produced from different materials. One restriction is that the standard holding part must be produced from a metal which can be wetted with tin, otherwise a layer which can be wetted with tin has to be applied to the spherical base of the holding part. This layer, which can be produced in various ways, such as, for example, by physical vapor deposition or electroplating, is rapidly attacked by the liquid tin—unless it is very thick—and tends to dissolve. After a short time, it is no longer possible sufficiently to guarantee that it constitutes a resistant and suitable boundary layer between the holding part and the support plate. The deposition of a layer which can be wetted with tin thus does not improve the fixing conditions and does not improve the costs and the complexity of the holding part.

The material for the production of the holding part must have sufficient deformability to withstand the die forming process but at the same time it may not be too weak or too soft, in order to guarantee rigid fixing. Usually, the holding part is produced from CuBe (copper-beryllium), nickel, invar or copper.

The optical support part is usually produced by processing a 1 mm thick sheet of either CuBe or invar or stainless steel or $Al_2O_3$. The choice of material depends on how the two parts are to be assembled.

Since the holding part is produced using a 0.1 mm thick metal sheet, it is characterized by high heat resistance, which enables the optical support part to be heat-insulated. This prevents damage to the optical support part during exposure to laser radiation. The heat flow which reaches the base of the holding part encounters considerable difficulties in being removed along the holding part, owing to its high heat resistance. Only a small quantity of heat can reach the optical support part, with the result that no dangerous heating-up is caused, and this slight heating can therefore be neglected.

The fact that the energy delivered by the laser remains limited to a small part of the holding part during the soldering process makes it possible to limit energy wastage and to use a less powerful laser station.

If the holding part contains an active element which generates heat, such as a laser diode or an electrical resistance, the high heat resistance of the holding part is even a disadvantage. Unless the heat generated by it were removed, the active element would inevitably be caused to fail, owing to its continuous heating-up.

The small dimensions do not permit the holding part to be provided with a radiator (heat sink). The use of the support plate as a radiator which can remove most of the heat generated is an appealing and possible solution. It can be achieved only if the support plate is produced using a material having high thermal conductivity, and also only if the heat can flow to the support plate. An inevitable consequence of this second point of view is the reduction in the heat resistance of the holding part. Where a large quantity of heat has to be removed, a sapphire support plate must be used (thermal conductivity 41 $Wm^{-1}/K^{-1}$). In all other cases, it is more advantageous to produce the support plate from materials which have a much lower thermal conductivity, such as Pyrex, $Al_2O_3$, zerodor, quartz and float glass. The float glass is least suitable because it can break during the soldering process since it does not withstand thermal shocks.

The soldering process, which is carried out, on a sapphire support plate, is actually extremely problematic owing to its high thermal conductivity. The amount of energy which has to be emitted by the laser in order to cause the tin layer to melt is much greater than the energy which would be required in the case of a support plate having a lower thermal conductivity. The existing ratio of the energy values which are required for a sapphire support plate and for any other support plate can be up to a factor of 2. The necessity of a much more powerful laser soldering station consequently requires a greater investment for purchasing the laser and also higher utilization costs.

If the support plate acts as a radiator, the holding part should be capable of transmitting to it the heat generated by the active element. This cannot actually be achieved if the holding part is characterized by high heat resistance. At the same time, if the holding part is characterized by low intrinsic heat resistance, the heat generated by the laser during the soldering process would rapidly reach the optical element and would then damage it. The heat resistance of the holding part must change during the process: a high resistance during the soldering process and a low resistance after the fixing means has been produced. This can be achieved by filling the ball socket with a suitable heat-conducting material. If 50° C. is assumed to be the maximum temperature which is not to be exceeded by any optical element, 0.5 W can be removed by a holding part which is fixed to a sapphire support plate and whose ball socket is not filled. The energy which can readily be removed becomes 0.75 W when the ball socket is filled with a suitable heat-conducting material.

$Al_2O_3$ can be used for producing a support plate. A thin sheet of $Al_2O_3$ permits passage of the laser beam for the soldering process. $Al_2O_3$ has good mechanical properties and its coefficient of thermal conductivity is smaller than the coefficient of thermal conductivity of sapphire but at the same time is much greater than the respective coefficient of thermal conductivity of other materials which are used for the production of support plates (thermal conductivity: 24 $Wm^{-1}K^{-1}$). An $Al_2O_3$ support plate can behave as a radiator without exhibiting the difficulties of a sapphire support plate.

The holding part has been given a spherical base because this is the ideal shape for ensuring good symmetry of the soldering agent. A balanced distribution of the mechanical parameters avoids shrinkage, which takes place during the solidification of the tin and rotates the holding part relative to the support plate. During the orientation phase, in spite of the fact that the holding part can rotate about its optical axis, no changes are introduced in the boundary conditions which are present at the interfaces between the base of the holding part and the support plate.

If the holding part were to be provided with a flat base, the solidification of the tin would take place with an additional rotation β, which is dependent on Y and also on the properties of the solder material, if the holding part were to have been rotated (about its optical axis) through an angle Y during the orientation phase.

β has a direction opposite to Y. The vertical difference between the coordinates A and B relative to the support plate after the rotation has been applied is:

$$Dy = AB \cdot TgY$$

A tin alloy solder whose melting point is 179° C. was used. Its coefficient of thermal expansion is $24 \cdot 10^{-6}$ $K^{-1}$. In this example, an ambient temperature of 20° C. was assumed. After the solidification, the vertical difference between A and B is:

$$Dy + 24 \cdot 10^{-6} \cdot Dy \cdot 159°.$$

The additional rotation is equal to:

$$\beta = Y - Tg^{-1}\left(\frac{Dy + 24 \cdot 10 \cdot Dy \cdot 159°}{AB}\right).$$

If a rotation of Y through 5° is considered and if AB=2 mm, the additional rotation β would be equal to 19 mrad.

If a rotation of Y through 2° is considered and if AB=2 mm, the additional rotation β would be equal to 7.6 mrad.

If a rotation of Y through 10° is considered and if AB=2 mm, the additional rotation β would be equal to 37.4 mrad.

The fact of placing a thin tin layer on the holding part base does not markedly adversely affect the possibility of arranging its angular position about its optical axis without the base coming into contact with the support plate. A table is provided for this purpose, in which the corresponding maximum rotation to which the holding part can be subjected without it coming into contact with the support plate is stated for each vertical space between the holding part base and the support plate:

Space=0.1 mm, permissible angle=12.80;

Space=0.2 mm, permissible angle=31.5°.

In the case of a space>0.3 mm, a complete rotation is permitted.

The spherical base of the holding part makes it possible to obtain the best results with regard to the accuracy of fixing. The final accuracy depends directly on the repeatability of shrinkage. Good accuracy of fixing can be achieved only if the shrinkage has been compensated beforehand. At present, a repeatability of the vertical shrinkage of the order of magnitude of a few microns has been measured by means of this technique and, if compensation is assumed, a repeatability of the total fixing of more or less 0.5 $\mu m$ can be achieved.

Since the soldering process is carried out by a robot assembly station, the accuracy of fixing is influenced by the gripper which is mounted on the robot. The gripper must grip the holding part, position it relative to external reference points, hold it in its position during the exposure to laser radiation and release it after it has been fixed. Owing to the small dimensions of the holding part (2×2×3 mm), it is difficult to grip it in a constant manner. When designing the gripper, it is necessary to make a fundamental choice. One solution is to design a gripper which is infinitely rigid and itself resists the force of shrinkage of the metal. Another possible solution is to produce a gripper having well defined resilience in the vertical direction. In this case, the metal shrinkage would not be hindered but would rather be permitted along an exact direction in space. It can be achieved by a linear guide having flexible rotary fastening means.

The second solution is preferred to the first one for the following reasons:

A design which can behave nondeformably to the force generated by the shrinkage of the tin metal would be too robust to be suitable for a robot station of high accuracy. The metal shrinkage generates a mechanical load which may be greater than the limiting tensile strength of the soldering agent, and which would then lead to failure of the fastening.

An example which illustrates a simplified typical case will now be described here. The thin layer is 1 mm thick and its heat shrinkage is equal to 4 $\mu m$. This value corresponds to an average of values obtained by experiments. Where the gripper is nondeformable, the soldering would react and would produce a stress which would tend to pull the support plate a distance toward the gripper. The magnitude of the distance moved would be: Dy=1004−1000 mm.

$$\varepsilon = \frac{\Delta l}{l} = \frac{1004 - 1000}{1000} = 0.004$$

$$\sigma = \varepsilon \cdot 7.2 \cdot 10^4 = 288 \text{ N/mm}^2$$

Since the load exerted on the tin in this case is much higher than its fracture limit, a defect would unavoidably result.

The use of a resilient design for the gripper does not adversely affect the final accuracy of fixing if it is assumed that the gripper design is sufficiently rigid to hold the holding part in a fixed position during the duration of exposure to radiation. The mechanical stresses actually occur only if the tin layer changes its phase and returns to the solid state. From this point onward, the deformability of the gripper is involved.

The necessary gripper force can be provided in various ways, but, owing to the small dimensions of the holding part, it is difficult to exert a force with sufficient caution. Owing to the high required accuracy of fixing, the holding part must be released by the gripper without its position being adversely affected. Most solutions where the gripping force is generated by a mechanical effect must be neglected because they can adversely affect the accuracy of fixing during the release phase.

The most suitable solution has proven to be a gripper whose force is generated by a magnet. A small magnet can be pushed inside a tube which is produced from a nonmagnetic material. A small soft iron disk is adhesively bonded to the top of the holding part. The tube is held vertically and the holding part which is to be gripped is pressed against the bottom of the tube. The dimension of the disk is slightly greater than the external dimension of the tube. During the gripping phase, the magnet is forced close to the end of the tube. In this position, it can exert a sufficient attractive force which is capable of keeping the soft iron disk continuously in contact with the end of the tube. The use of any positioning pin makes it possible to ensure sufficient accuracy of gripping. As soon as fixing has been completed, the holding part can be released without introducing any additional load. The magnet is raised along the tube while the soft iron disk remains in contact with the end of the tube. The force exerted by the magnet during its movement cannot influence the disk because it is already at its end point. During the removal of the magnet, the force exerted by the magnet becomes weaker and weaker and can be neglected after some time. At this time, the holding part is completely free, and no mechanical load is exerted during the release phase.

The device for fixing or holding can compensate its thermal expansion since it is composed of two separate parts. This aspect can be particularly expedient where a temperature gradient is present on the support plate at a specific time. This can occur when a support part holds an active heat-generating element, such as, for example, a laser diode.

The holding part and the optical support part can be assembled beforehand, a simple pair of laser spot welds being used, and each welding point being provided at the upper end of the flaps of the holding part. In this way, the optical support part can, owing to the temperature gradient, expand downward relative to the holding part because it is connected only by its upper section. At the same time, the holding part which has the optical support part expands upward relative to its base or to the support plate. When the two expansions have reached the same magnitude their overall effect is equal to zero with respect to the base of the holding part, and this means that the thermal expansion has been compensated in this respect. This compensation can be achieved either by joining a suitable pair of materials—for the production of the holding part and of the optical support part—or by arranging the laser welding points, which are used for fixing the optical support part to the holding part, in the correct position.

However, complete thermal compensation relative to the support plate cannot be achieved because this would also require compensation of the thermal expansion of the tin soldering. Although compensation of the tin layer by the system geometry and by the physical properties of the materials used would be permitted, it cannot be achieved. The space present between the holding part base and the support plate cannot in fact be defined beforehand. It is actually defined only during the orientation phase and then changes its value for each of the elements. The optical support part and the holding part are assembled beforehand, before the holding part is fixed to the support plate. It is thus not possible to compensate beforehand a quantity whose value is unknown. Although the thermal expansion cannot be completely compensated between support part and support plate, its influence can at least be limited. In most cases, the support plate is in any case completely exposed to the same thermal gradient. The elements then expand with the same magnitude and remain oriented in spite of the expansion.

Some examples are provided by the feasibility of this principle. Let us assume the use of a soldering agent comprising the alloy having the composition: 62Sn36Pb2Ag, whose coefficient of thermal expansion is $24 \cdot 10^{-1}$.

The holding part can be produced by die forming of a 0.1 mm thick invar sheet whose coefficient of thermal expansion is $2 \cdot 10^{-6} K^{-1}$. The optical support part is produced from silver, whose coefficient of thermal expansion is $19 \cdot 10^{-6} K^{-1}$. It was assumed that the soldering agent has to fill a space of 0.2 mm for fixing. The assembly of the holding part and of the optical support part has been implemented in such a way that complete compensation of thermal expansion was achieved. An operating temperature gradient of 50° C. was assumed. The total expansion is the result of the difference between the upward expansion and the downward expansion. The upward expansion is equal to the expansion of the holding part plus the expansion of the soldering agent, while the downward expansion is produced only by the expansion of the optical support part. The total expansion can be represented by the following equation, in which X has been assumed to be the mutual spacing which has to be left between the laser spot and the optical axis in order to obtain a total expansion of zero:

$=Dy_{downward}-Dy_{upward}=Dy_{holding\ part}+DY_{soldering\ agent}-Dy_{optical\ support\ part}=0$ $Dy=0.2 \cdot 24 \cdot 50 \cdot 10^{-6}+1.8 \cdot 2 \cdot 50 \cdot 10^{-6}+X \cdot 2 \cdot 50 \cdot 10^{-6}-X \cdot 19 \cdot 50 \cdot 10^{-6}=0$ $Dy=0.00042+0.00105 \cdot X=0$ $X=0.4$ mm.

In this special case, the laser welding points must be arranged 0.4 mm above the optical axis in order to cancel out any thermal expansion. The downward expansion of the optical support part is in fact equal to the upward expansion of the total holding part plus the expansion of the soldering agent. This example shows that it is possible in principle effectively to perform complete compensation of the system. The only problem is that the value of the space between the holding part base and the support plate, which in this case is equal to 0.2 mm, cannot be defined beforehand.

Usually, during the assembly phase, expansion of the soldering agent is either neglected or an average value is considered. Some examples in which the expansion of the soldering agent has been neglected will now be presented.

The case is considered in which the holding part was produced from invar having a coefficient of thermal expansion of $2 \cdot 10^{-6} K^{-1}$, while the optical support part was produced from copper-beryllium, having a coefficient of thermal expansion of $9 \cdot 10^{-6} K^{-1}$. In this case too, the vertical expansion of the device can be represented by the following equation:

$$Dy = Dy_{holding\ part} - Dy_{optical\ support\ part} = 0$$

$$Dy = 1.8 \cdot 2 \cdot 50 \cdot 10^{-6} + X \cdot 2 \cdot 50 \cdot 10^{-6} - X \cdot 9 \cdot 50 \cdot 10^{-6} = 0$$

$$Dy = 0.00018 + 0.00035 \cdot X = 0$$

$$X = 0.51\ mm$$

Compensation of the thermal expansion of the holding part would require arranging the pair of laser spot welds 0.51 mm above the optical axis of the element.

In another case, the support device was produced from copper-beryllium while the optical support part was produced from copper having a coefficient of thermal expansion of $17 \cdot 10^{-6} K^{-1}$. The expansion of the holding part is:

$3 \cdot 50 \cdot 9 \cdot 10^{-6} = 0.00135$ mm.

The expansion of the optical support part is:

$X \cdot 50 \cdot 17 \cdot 10^{-6}$. This results in:

$$X = \frac{0.00135}{0.00085} = 1.59\ mm.$$

In this particular case, the thermal expansion cannot be fully compensated, owing to the limitations of the geometry of the optical support part.

The maximum permissible distance between the optical axis and the laser welding point may not be greater than 1 mm. Since the optical support part has a height of 2 mm, a laser welding point may not be further than 1 mm away from the horizontal center line of the optical support part.

In this case, although complete compensation cannot be achieved, it is possible to carry out partial compensation in order to improve the accuracy of fixing. Without any compensation, the heat shrinkage of the holding part would be 0.00135 mm. In contrast, if the maximum permissible compensation is carried out, the result can be reduced to:

Expansion of the holding part—Expansion of the optical support part=0.00135−0.00085=0.0005 mm.

The solutions proposed to date are not completely fixed; instead, it is possible to implement many modifications in order to adapt the technique to the requirements of different applications. For example, the support plate used may be a silicon plate in order to make it compatible and then directly to integrate the optical design with microelectronic modules which are produced using silicon. Since silicon has good transparency for laser light having a wavelength between about 1.4 μm and 15 μm, a $CO_2$ laser beam can be used for carrying out the fixing.

It is possible for the same hybrid silicon module to contain the optical design which is produced using the "TRIMO" (three-dimensional miniaturized optical) technology and an "SMD" (surface mounted device) electronic module. This solution would limit the problem due to poor adaptation of the thermal expansion.

In some particular cases, fixing can be carried out by exposing the holding part to UV light for curing an adhesive between the support plate and the holding part base, instead of carrying out a laser soldering process. The orientation of the holding part can be performed until the correct position is reached. The adhesive is then exposed from below the support plate to the UV light beam, with the result that it polymerizes, and fixing is then effected. Since the adhesive is rather fluid before exposure to the UV light beam, the lower surface of the holding part can come into contact with the adhesive without any stress being introduced into the holding part. This solution makes it possible to obtain bonds which achieve the required properties of rigidity and reliability only when the adhesive is not impaired by the creep effects or aging problems.

In many cases, the optical elements used are very expensive and furthermore the assembly requires considerable work. For this reason, it is necessary, since a replacement element cannot be provided, to develop an alternative solution which makes it possible to fix an element, whose normal fixing process has failed, to the support plate in any case. This can be achieved by applying a fixed amount of tin soldering paste to the region on the support plate where the element is to be fixed. The optical element is oriented relative to its external reference points, while its underside is moved into the soldering paste. The fact that the soldering paste is particularly soft means that no mechanical stress is generated or need be feared. Once the optical element has been completely oriented relative to the laser beam to which it is exposed from below the support plate, it permits melting of the tin solder paste which adheres firmly to the support plate and the holding part, simultaneously resulting in the required fixing.

Where the exposure to laser radiation is not the most suitable method for melting the soldering agent, other solutions can be considered. The required heat can in fact be introduced either by electrical resistance soldering or by magnetic induction soldering.

The subject of the invention is described in more detail below on the basis of embodiments with reference to the attached drawings.

FIG. 1 shows a schematic diagram illustrating the principle of temperature compensation in an embodiment of a support device according to the invention;

FIG. 2 shows a holding part in an embodiment of a support device according to the invention;

FIG. 3 shows a holding part according to FIG. 2, which is shown with a support part for a component, which support part is coordinated with said holding part, and FIG. 4 shows the holding part with support part fixed to it.

FIG. 1 shows a schematic sectional diagram of an exemplary support device according to the invention, denoted in general by 1.

A holding part 3, as a first part, is fixed on a baseplate 2. The holding part 3 is formed from a metal strip which is bent into a "U"-shape. The holding part 3 has two "U"-limbs 4, 4' which are connected by a curved base section 6. The "U"-limb 4' is longer than the "U"-limb 4 and can be gripped by its extension by a robot gripper during the automatic assembly. The baseplate 2 is provided on its surface with surface regions 7 which are suitable for a solder joint 8. The holding part 3 is soldered with its "U"-shaped base section 6 to these surface regions 7 of the baseplate 2. If the metal strip cannot be soldered on directly, it is suitably coated beforehand.

A support part 12, as a second part, which is shown in the form of a rectangular plate, is arranged between the "U"- limbs 4, 4' of the holding part 3. The support part 12 is fixed to the holding part 3. Fixing to the holding part 3 is effected at a fixing point 13 in the end region of the "U"-limb 4 which is on the left in the diagram, and at the same height to a fixing point 13' on the right "U"-limb 4'. On the plate-like support part 12, the fixing points 14, 14' are present at the left and right lateral edges 15, 15', respectively, but exclusively close to that end edge 16 which is further away from the base section 6. Consequently, the plate-like support part 12 is fixed only on one side or in a cantilevered manner in the region of its end edge 16. Apart from this fixing between holding part 3 and support part 12, there is no other rigid connection between them. The connection of holding part 3 and support part 12 can be effected, for example, by spot welding.

The support part 12 is formed with a central orifice 17 in which a component (not shown) is supported. If the support device shown is subjected to a temperature change—for example a temperature increase, the two "U"-limbs 4, 4', which are connected by the base section 6 to the baseplate 2, expand, only the expansion in their longitudinal direction being considered here to be relevant for the position of the component. The distance between the fixing points 13, 13' on the "U"-limbs 4, 4' on the one hand and the base section 6 on the other hand increases as a result of thermal expansion, cf. the upward-pointing arrow 5. At the same time, the plate-like support part 12 also expands, namely in the direction toward the base section 6, since it is connected in its upper section firmly to the U-limbs 4, 4' at said fixing points 14, 14', cf. the downward-pointing arrow 9.

If the change in length of the "U"-limbs 4, 4' between said fixing points 13, 13' and the base section 6 is made just as large as the change in length of the plate-like support part 12 between its fixing points 14, 14' and the center of the orifice 17, then the distance between this center and the base section 6 remains constant, independently of temperature changes. FIGS. 2 to 4 show phases of the assembly of a further embodiment of a support device according to the invention.

FIG. 2 shows a holding part 20 which is produced from a base part 21 which is in the form of a ball socket and has an edge region 23 surrounding an orifice 22 of the base part 21. The outer periphery of the edge region 23 is, for example, square. Two strip-like upright flaps 24, 24' are provided on two opposite sides of the edge region 23. As in the case of the right "U"-limb in FIG. 1, here too the right flap 24' is slightly longer than the left flap 24. The holding part 20 is preferably formed as an integral unit 21, 23, 24, 24'.

FIG. 3 shows a parallelepiped-shaped support part 26 having a central passage 27. A schematically shown optical element 28 is arranged in said passage. It can be seen that the support part 26 is formed in such a way that it can be inserted between the two flaps 24, 24'.

FIG. 4 shows the support part 26 held by the holding part 20. Said support part is connected to the holding part 20 by two spot welds opposite one another, only one of which 29 is visible. In the case of a temperature change, the two strip-like flaps 24, 24' can expand or contract relative to the base part 21. The same applies to the support part 26, but the change in length is opposite to that of the flaps 24, 24' With corresponding dimensions of the parts and choice of materials with regard to the coefficient of thermal expansion, the distance between the center of the passage 27 and the base part 21 can be kept to a large extent constant independently of the temperature.

List of Reference Numerals
1—support device
2—baseplate
3, 20—holding part ("first part")
4—"U"-limb
4'—(longer) "U"-limb
5—arrow, upward-pointing
6—(curved) base section
7—surface region on (2), suitable for (8)
8—solder joint
9—arrow, downward-pointing
12—support part ("second part")
13—fixing point on (4)
13'—fixing point on (4')
14, 14'—fixing points on (15, 15')
15, 15'—lateral edges of (12)
16—end edge of (12)
17—central orifice of (12)
21—base part (in the form of a ball socket)
22—orifice of (21)
23—edge region of (21)
24—strip-like upright flap
24'—strip-like upright (longer) flap
26—parallelepiped-shaped support part ("second part")
27—central passage
28—component; optical element
29—spot weld ("fixing point")

What is claimed is:

1. A device for supporting a miniaturized component, comprising a first part (3, 20) formed with a base (21) having a convex surface and a first and a second flaps (24, 24') arranged upright on said base (21), wherein a first fixing point (13) for a second part (12, 26) is arranged on said first flap (24) and a second fixing point (13', 29) for said second part (12, 26) is arranged on said second flap (24'), and said second part (12, 26) supports the component (28), said second part (12, 26) being fixed to the first part (3, 20) between said first and second flaps (24, 24') at said first and second fixing points (13, 13', 29) of each of said first and second flaps (24, 24') on opposite sides of the second part (12, 26), and a support (17, 27) for the component (28) is arranged on said second part (12, 26), wherein (i) the position of said support (17, 27) on the second part (12, 26) is chosen related to the first and second fixing points (13, 13', 29) between the first (3, 20) and the second (12, 26) parts, and (ii) a first material of the first part (3, 20) has a specific coefficient of thermal expansion $\alpha_1$ and a second material of the second part (12, 26) has a specific coefficient of thermal expansion $\alpha_2$ such that an influence of a thermal expansion of the first part (3, 20) on a position of the support (17, 27) of the component (28) relative to the base (21) is at least partly compensated by an influence of a thermal expansion of the second part (12, 26).

2. The device of claim 1 wherein said component (28) is selected from the group consisting of:
an electronic component, and
an optical component.

3. The device of claim 1 wherein said base (21) having a convex surface is formed as a ball socket.

4. The device as claimed in claim 1, wherein the second flap (24') is formed with a length greater than the first flap (24), so that the first part (20) can be held, moved or positioned on the second flap (24') by a transport and positioning device.

5. The device as claimed in claim 1, wherein the first part (3, 20) is an integral unit.

6. The device as claimed in claim 4, wherein the first part (3, 20) is an integral unit.

7. The device as claimed in claim 1, wherein the first part (3, 20) is produced from a metal.

8. The device as claimed in claim 7, wherein the metal is Cu.

9. The device as claimed in claim 1, wherein the second part (12, 26) is produced from a metal.

10. The device as claimed in claim 9, wherein the metal is Cu.

11. The device as claimed in claim 7, wherein the first part (3, 20) is produced from a ceramic material.

12. The device as claimed in claim 11, wherein the a ceramic material is $Al_2O_3$.

13. The device as claimed in claim 1, wherein the second part (12, 26) is produced from a ceramic material.

14. The device as claimed in claim 13, wherein the ceramic material is $Al_2O_3$.

15. The device as claimed in claim 1, wherein the first part (3, 20) is produced from a metal alloy.

16. The device as claimed in claim 15, wherein the a metal alloy is CuBe alloy.

17. The device as claimed in claim 1, wherein the second part (12, 26) is produced from a metal alloy.

18. The device as claimed in claim 17, wherein the metal alloy is CuBe alloy.

* * * * *